United States Patent [19]

Cecchi et al.

[11] Patent Number: 4,902,916
[45] Date of Patent: Feb. 20, 1990

[54] IDENTIFICATION OF DEFECTS IN EMITTER-COUPLED LOGIC CIRCUITS

[75] Inventors: Delbert R. Cecchi; Nghia van Phan, both of Rochester, Minn.

[73] Assignee: International Business Machines Corporation, Armonk, N.Y.

[21] Appl. No.: 270,880

[22] Filed: Nov. 14, 1988

[51] Int. Cl.$^4$ ............... H03K 19/086; H03K 19/003; H03K 17/62; G11C 11/40
[52] U.S. Cl. ..................... 307/455; 307/482.1; 307/303.1; 307/355; 371/25.1; 371/22.1
[58] Field of Search ............ 307/455, 467, 482.1, 307/303.1, 355, 360, 362, 363, 475; 371/15, 24, 25, 36; 370/16, 84

[56] References Cited

U.S. PATENT DOCUMENTS

| | | | |
|---|---|---|---|
| 4,410,816 | 10/1983 | Kanai | 307/455 |
| 4,517,476 | 5/1985 | Barre | 307/455 |
| 4,580,066 | 1/1986 | Berndt | 307/467 X |
| 4,628,217 | 12/1986 | Berndt | 307/455 X |
| 4,658,400 | 4/1987 | Brown et al. | 371/25.1 |
| 4,757,216 | 7/1988 | Tanahashi | 307/455 |

Primary Examiner—Stanley D. Miller
Assistant Examiner—David R. Bertelson
Attorney, Agent, or Firm—J. Michael Anglin

[57] ABSTRACT

An ECL logic circuit uses a single resistor in place of separate current-source and emitter-follower resistors. A single tap connects a point on this resistor to the ground bus, and the signal-output line connects to this resistor by a contact which is separate from the contact connecting the emitter of the ouput transistor to the resistor.

6 Claims, 2 Drawing Sheets

IDENTIFICATION OF DEFECTS IN EMITTER-COUPLED LOGIC CIRCUITS

BACKGROUND

The present invention relates to a semiconductor circuits, and more particularly concerns a chip layout for preventing certain fabrication defects from escaping detection in emitter-couple logic circuits.

Emitter-coupled logic (ECL) is a very high-speed form of logic employing bipolar transistors. An ECL circuit typically employs a function stage for performing a logic function of one or more inputs, and also has an output stage in the form of an emitter follower for driving succeeding ECL circuits. The circuit output is taken across a resistor connected to the emitter of the output transistor and ground. If this resistor is open-circuited due to a fabrication fault in the chip containing the circuit, the circuit will still operate, but at a reduced speed. ECL circuits are commonly tested at a speed which is very low in comparison with its operating speed. This "DC" testing therefore will not detect such a failure.

AC testing—i.e., testing at full operating speed—would detect this type of failure, but such testing is very expensive. With a typical circuit delay of 0.5 nsec or less, such circuits would require microwave techniques in the test equipment and in jigs and fixtures for full testing. One technique for avoiding AC testing of ECL circuits is the use of double contacts at certain points in the circuits. This approach decreases circuit density and still does not provide absolute testability, especially since contacts near each other are more likely to fail together. U.S. Pat. Nos. 4,517,476 (Barre) and 4,410,816 (Kanni), and 28 IBM Technical Disclosure Bulletin 1746-47 (Beh) show other techniques to detect such failures; all of these, however, add additional components to the circuit. Such additional components decrease the overall circuit density and add cost to the fabrication process.

SUMMARY OF THE INVENTION

The present invention achieves full testability of ECL circuits using only DC (i.e., low speed) testing, yet does not add any components to the circuits. The invention achieves this results by reconfiguring the circuit layout, without any penalty in additional components, lower density, or increased fabrication or testing cost.

Broadly speaking, the invention uses a single resistor in place of the conventional separate current-source and emitter-follower resistors. A single tap connects a point on this resistor to the ground bus, and the signal-output line is coupled to this resistor by a contact which is separate from the contact connecting the emitter of the output transistor to the resistor.

DESCRIPTION OF A PREFERRED EMBODIMENT

Figure 1:
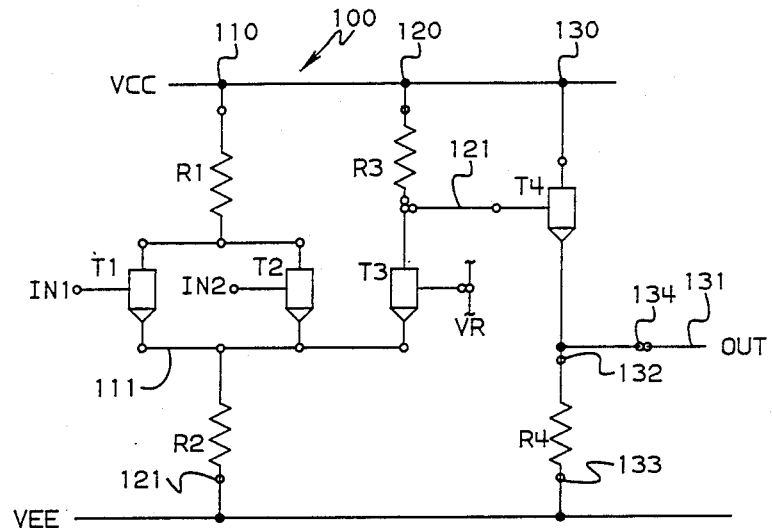
FIG. 1 is a circuit diagram of an ECL logic circuit according to the prior art.

FIG. 1 is a circuit diagram of a standard ECL circuit 100 for performing a logic OR function of two active-high input signals. Small open circles in the diagram represent contact points between different layers in an actual chip layout of the circuit. Any of these contacts is subject to failure, leaving that point unconnected.

Input signals IN1 and IN2 connect to the bases of transistors T1 and T2. The collectors of these transistors are coupled to each other and to a dropping resistor R1. The other end of R1 connects to a supply-voltage bus VCC, usually from 1.7 to 5.0 volts (preferably 3.6 volts in the technology used in this example). The emitters of T1 and T2 are coupled together and to a current-source resistor R2, whose other end connects to a supply-voltage bus VEE. This bus may be at ground potential or at some other voltage lower than VCC. These components thus constitute a function stage 110 whose output voltage at the emitters of T1, T2 is high whenever the voltage at either IN1 or IN2 is high—that is, an active-high OR function, or, equivalently, an active-low AND function. For the purposes of the present invention, however, this stage could perform some other logic function of any number of inputs.

Thresholding stage 120 determines whether the function-stage output at point 111 is above or below a threshold voltage VR. Transistor T3 has an emitter coupled to point 111, and a collector coupled to supply bus VCC via resistor R3. Its base is tied to a bus VR carrying a reference voltage common to all circuits on the same chip. This voltage is about halfway between the logic "0" voltage and the logic "1" voltage, or about 2.5 volts in the present example. When line 111 holds its emitter higher than VR, T3 cannot conduct, and R3 holds line 121 high. But, when line 111 floats (that is, when neither T1 nor T2 conducts), R2 holds T3's emitter lower than VR, T3 conducts, and the voltage divider formed by R2, R3 holds line 121 at a lower voltage.

Output stage 130 is an emitter follower for driving current into circuit output line 131, labelled OUT, when the voltages at input lines IN1, IN2 satisfy the function of stage 110. Thus, when T3 does not conduct, R3 holds the base of T4 high so that it conducts and drives current from the VCC bus into the OUT line 131. But, when T3 conducts, the voltage on line 121 is low enough to cut off T4. Emitter-follower resistor R4 then pulls OUT line 131 down to the logic "0" voltage. OUT is normally connected to an input line, similar to IN1, IN2, of another logic circuit (not shown) similar to circuit 100.

The relative values of R1 and R2 are such that the emitters of T1, T2 are one base-emitter drop (Vbe) above VR when either transistor conducts. The relative values of R2 and R3 ensure that line 121 is below VR when T3 conducts. R3 must also provide sufficient base current to hold T4 on when T3 is cut off. The value of R4 is chosen high enough to limit current to a reasonable value when T4 conducts, yet low enough to provide a high-speed drain for current back from the base of a succeeding stage input transistor to the VEE bus. For present ECL technologies, all of the resistors are in the range of a few kilohms or less. Representative values for this embodiment are: R1=0.7 kOhm, R2=1.8 kOhm, R3=0.7 kOhm, and R4=2.0 kOhm. The total delay of circuit 100 is less than 500 psec.

The small circles in the diagram of circuit 100 represent contact points on the actual layout of the circuit. These are points where a silicon layer connects to a metal conductor layer, or where one metal layer connects to another metal layer, through a vertical hole or via in an insulating layer between them. Any of these points is subject to failure in the fabrication process of the chip holding circuit 100. That is, the via might be not be sufficiently open, or the metal in one layer might not be present or might be too thin to establish adequate contact. A defect such as this results in an open circuit between the lines at the circle representing the contact.

A chip containing circuits such as 100 are commonly tested for DC faults. That is, various combinations of DC potentials are applied to input lines, and the output voltages are monitored for the proper values. Test patterns of these DC voltages change at a rate which is at least several orders of magnitude below the operating speed of the circuits. Such DC testing will catch errors at all the contact points shown in FIG. 1, except for those at the ends of R4, labelled 132 and 133. If either contact 132 or contact 133 is open, R4 is effectively disconnected from the circuit. The circuit will, however, continue to operate correctly under DC testing: When T4 conducts, it will drive current into the OUT line and thence into an input line similar to IN1, turning on an input transistor similar to T1, in a succeeding circuit; when T4 cuts off, the OUT line will float, and recombination in the base region of the succeeding-circuit input transistor eventually lowers its base potential enough to cut it off. The effect of this condition is to lower the effective operating speed of the overall circuit 100 by a factor of ten or more—still high enough to pass a DC test. These missing contacts would of course be detected by AC testing at the full operating speed; but this type of testing is very expensive, requiring very-high-speed test equipment and fixtures and test patterns which are difficult to develop.

Figure 2:
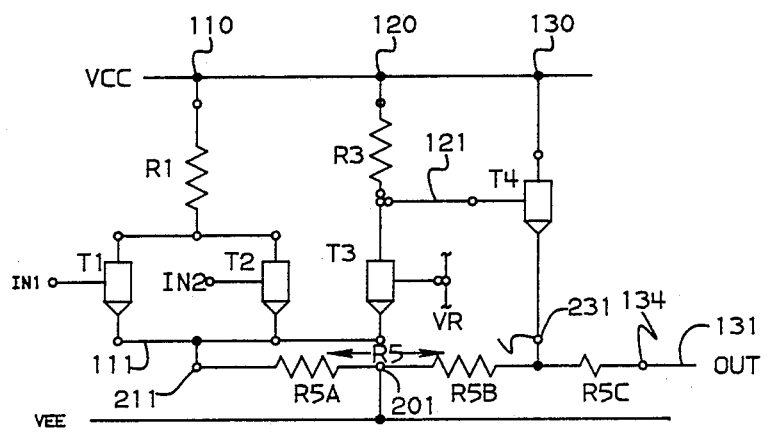
FIG. 2 is a circuit diagram of an ECL logic circuit according to the invention.

FIG. 2 shows a circuit 200 in which every missing contact point can be detected by a low-speed DC test of the circuit. All of the components are the same as in FIG. 1, except for the physical relocation of resistors R2 and R4 and of contacts 112 and 132–134.

In terms of the schematic of FIG. 2, a single tapped resistor R5 replaces the two resistors R2, R4 and is coupled to the output-line contact directly, with a separate connection to the emitter of T4. This configuration ensures that any defective contact in the circuit, including a defective contact to the emitter-follower resistor, results in a fault under a DC test. That is, circuit 200 converts an AC fault into a DC fault, and thus eliminates any need for high-speed AC testing of circuit 200.

The portion R5A of R5 between contacts 211 and 201 has the same value as R2 in FIG. 1; the portion R5B between contacts 201 and 231 has the same value as R4. The portion R5C between contacts 231 and 134 is not critical—it need only have a sufficiently small value (including zero) in comparison with the other resistances in circuit 200 that it does not appreciably affect the operation of the circuit. An open circuit in any of these contacts now results in a DC fault of the entire circuit 200. An open contact 211 is detected in the same way it would have been in circuit 100. An open contact 201 isolates R5B from the VEE bus, but now it also ties the emitter of T4 to the emitters of the functionstage devices T1, T2. In this case, line 121 and the OUT line 131 remain stuck at a high voltage. An open contact 231 ties the OUT line 131 to ground potential through R5C and R5B, making it totally unresponsive to the IN1, IN2 signals, thus producing a fault. An open contact 134 is detected as it would have been in circuit 100.

Figure 3:
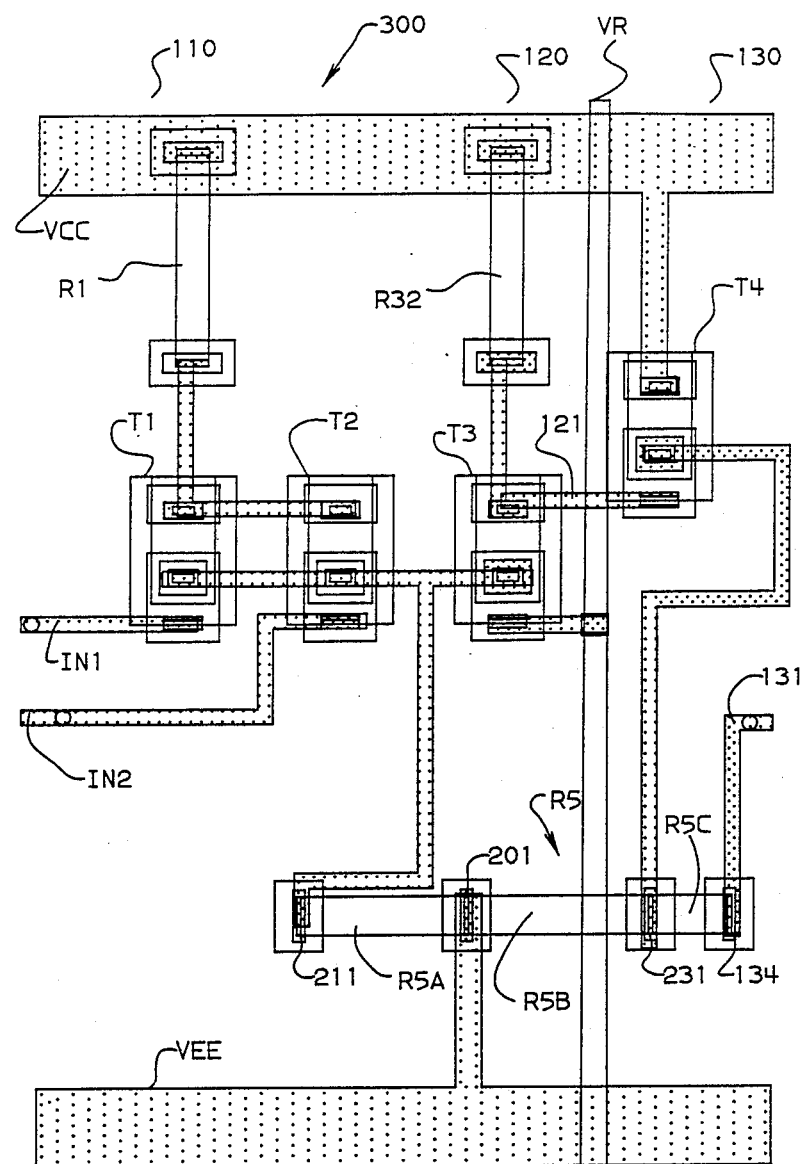
FIG. 3 shows a layout of the circuit of FIG. 2 on a semiconductor chip.

FIG. 3 shows a physical layout of circuit 200 on an integrated-circuit chip 300. All components are labelled as in FIGS. 1 and 2. The bipolar transistors and the resistors are formed in silicon, shown unshaded. The metal links between the contacts, as well as the voltage buses VCC and VEE, are formed in first metal, indicated by light shading. The VR bus is formed in a second-metal layer. Contacts in vias between these layers are in dark shading. The formation of R5 as a single resistor bar is convenient for the layout in this embodiment. If preferred, the individual segments R5A and R5B could be formed separately, as long as R5A could not be isolated from R5B by any contact failure. Furthermore, R5C performs no circuit function; it could be eliminated (or its value made zero), as long as no contact failure could isolate R5B from OUT line 131 without also disconnecting the emitter of T4 from that line. This concept may have value in other multi-stage emitter-follower circuits as well.

What is claimed is:

1. A structure for an emitter-coupled logic circuit having a plurality of input transistors, first and second supply buses, and an output transistor, each of said transistors having a collector, and emitter, and a base, said structure comprising:
   a single unitary resistor having at least first, second and third contacts at different points along its length;
   first connection means for coupling said first contact to the emitters of said input transistors;
   second connection means for coupling said second contact to one of said supply buses; and
   third connection means for coupling said third contact to the emitter of said output transistor.

2. The structure of claim 1, wherein said resistor has a fourth contact at a point along its length near said third contact, and further comprising:
   an output line; and
   fourth connection means for coupling said fourth contact to said output line.

3. The structure of claim 2, wherein said third contact lies between said second and said fourth contacts on said unitary resistor.

4. The structure of claim 1, wherein said second contact lies between said first and said third contacts on said unitary resistor.

5. A structure for an emitter-coupled logic function circuit on a semiconductor chip having a first layer and a plurality of other layers, said structure comprising:
   a high supply voltage bus;
   a low supply voltage bus;
   a plurality of input signal lines;
   a plurality of input transistors each having a collector, a base, and an emitter, said each base being coupled to one of said input signal lines;
   an output line;
   an output transistor having a collector, a base, and an emitter;
   first and second resistance means formed in said first layer of said chip and directly coupled to each other in said first layer;
   first connection means formed in one of said other layers of said chip for coupling said first resistance means to said input-transistor emitters;
   second connection means in one of said other layers of said chip for coupling said first and second resistance means to said low supply voltage bus;

third connection means formed in one of said other layers of said chip for coupling said second resistance means to said output-transistor emitter; and fourth connection means in one of said other layers of said chip for connecting said second resistance means to said output line independently of said third connection means.

6. The structure of claim 5, wherein said third connection means includes a contact to said first layer at a particular location along said second resistance means, and wherein said fourth connection means includes a contact to said first layer at a location on said second resistance means which is close to but distinct from said particular location.

* * * * *